United States Patent
Rogy et al.

(10) Patent No.: US 8,448,870 B2
(45) Date of Patent: May 28, 2013

(54) TRANSPONDER AND METHOD OF PRODUCING A TRANSPONDER

(75) Inventors: Reinard Rogy, Graz (AT); Christian Zenz, Graz (AT)

(73) Assignee: NXP B.V., Eindhoven (NL)

( * ) Notice: Subject to any disclaimer, the term of this patent is extended or adjusted under 35 U.S.C. 154(b) by 411 days.

(21) Appl. No.: 12/307,768

(22) PCT Filed: Jul. 9, 2007

(86) PCT No.: PCT/IB2007/052688
§ 371 (c)(1),
(2), (4) Date: Jan. 7, 2009

(87) PCT Pub. No.: WO2008/007326
PCT Pub. Date: Jan. 17, 2008

(65) Prior Publication Data
US 2009/0294542 A1    Dec. 3, 2009

(30) Foreign Application Priority Data
Jul. 10, 2006  (EP) ..................... 06116893

(51) Int. Cl.
*G06K 19/06*  (2006.01)

(52) U.S. Cl.
USPC ............................ 235/492; 235/451; 235/488

(58) Field of Classification Search
USPC .......... 235/375, 451, 492, 487, 488; 257/528, 257/502, 509; 340/572.1, 572.7; 438/107
See application file for complete search history.

(56) References Cited

U.S. PATENT DOCUMENTS

| | | | | |
|---|---|---|---|---|
| 5,757,074 A | * | 5/1998 | Matloubian et al. | 257/702 |
| 5,903,239 A | * | 5/1999 | Takahashi et al. | 343/700 MS |
| 6,125,043 A | | 9/2000 | Hauer et al. | |
| 6,239,703 B1 | * | 5/2001 | Friedman et al. | 340/572.7 |
| 6,337,265 B1 | | 1/2002 | Trezza et al. | |
| 6,841,862 B2 | | 1/2005 | Kikuchi et al. | |
| 2001/0017414 A1 | | 8/2001 | Gilleo | |
| 2002/0011677 A1 | * | 1/2002 | Yokoi et al. | 257/782 |
| 2002/0027294 A1 | * | 3/2002 | Neuhaus et al. | 257/778 |
| 2002/0064930 A1 | | 5/2002 | Ishikawa | |
| 2003/0116790 A1 | * | 6/2003 | Kikuchi et al. | 257/208 |
| 2004/0131947 A1 | * | 7/2004 | Fisch Gallagher et al. | 430/5 |
| 2005/0093090 A1 | * | 5/2005 | Shindo | 257/528 |
| 2006/0081982 A1 | * | 4/2006 | Huang et al. | 257/737 |
| 2007/0158804 A1 | | 7/2007 | Hosoya et al. | |
| 2007/0216534 A1 | * | 9/2007 | Ferguson et al. | 340/572.7 |
| 2008/0220597 A1 | * | 9/2008 | Cameron et al. | 438/530 |

FOREIGN PATENT DOCUMENTS

| | | |
|---|---|---|
| EP | 1022774 A2 | 7/2000 |
| EP | 1667221 A1 | 6/2006 |
| JP | 05 218135 A1 | 8/1993 |

* cited by examiner

*Primary Examiner* — Tuyen K Vo

(57) ABSTRACT

In a method of producing a transponder (1) an integrated circuit (2, 72, 82) is produced. The integrated circuit (2, 72, 82) is produced by applying a photoresist layer (11) on a surface (8) of a semiconductor device (4), generating a patterned mask (14) by lithographically patterning the photoresist layer (11) so that the photoresist layer (11) comprises at least one aperture (12, 13), and filling the aperture (12, 13) with a bump (15, 16, 75, 76) by depositing the bump (15, 16, 75, 76) on the surface (8) utilizing the patterned mask (14). Finally, the integrated circuit (2, 72, 82), with the patterned mask (14), is attached to a substrate (3), which comprises an antenna structure (18). The bump (15, 16, 75, 76) is connected electrically to the antenna structure (18).

19 Claims, 4 Drawing Sheets

TRANSPONDER AND METHOD OF PRODUCING A TRANSPONDER

FIELD OF THE INVENTION

The invention relates to a transponder and to a method of producing a transponder.

BACKGROUND OF THE INVENTION

A transponder or tag comprises an integrated circuit and an antenna. The integrated circuit is designed to process a signal captured by the antenna and, in response to the captured signal, to generate a response signal to be transmitted by the antenna. The antenna is normally supported by a substrate and the integrated circuit is attached to the substrate by the so-called flip-chip mounting process.

A known integrated circuit comprises contacts at the surface facing toward the substrate. The contacts are comprised of connection pads connected to bumps, which bumps are electrically connected to the antenna. When producing the transponder, the integrated circuit is attached to the substrate, e.g. by means of a glue layer spread over the substrate. The integrated circuit is then pressed onto the substrate with the glue layer, wherein the surface of the circuit comprising the bumps faces towards the substrate. Because of the pressure, particularly the bumps and the area around the bumps of the integrated circuit, as well as the antenna structure around the area where the bumps press against the substrate, may be subjected to severe stress what eventually leads to deformation of the bumps and the antenna around the bumps. Because of the deformed bumps, the distance between the antenna and the integrated circuit may differ, resulting in different stray capacitances between the antenna and conducting layers of the integrated circuit. Especially when used as an RFID (radio frequency identification) or a UHF (ultra high frequency) tag these different stray capacitances may compromise the performance of the transponder.

Published U.S.-application for patent 2003/0017414 A1 discloses a method of producing a flip chip having solder bumps, an integrated underfill, and a separate flux coating. Initially, a semiconductor device having connection pads on a surface thereof and an underfill material applied to the surface is processed so that the underfill material forms apertures positioned precisely at the connection pads. The main component of the underfill material is a thermoplastic resin. The apertures are made utilizing a photoablation process, because a photoablation process needs only a minimum amount of heating. Then, the apertures are filled with a solder material to form solder bumps electrically connected to the pads. The solder bumps extend slightly above the underfill material.

When mounting this flip chip on a substrate by pressing the flip chip against the substrate and heating up the solder bumps, then the thermoplastic resin of the underfill softens or even melts and hence likely is deformed what results in different distances between the surface of different flip chips and their substrates. This results in different stray capacitances between the conducting layers of the substrate and conducting layers of the flip chip what in turn may lead to malfunction of the transponder.

OBJECT AND SUMMARY OF THE INVENTION

It is an object of the present invention to provide a method of producing a transponder comprised of an integrated circuit attached to a substrate with an antenna structure, which method results in transponders with predefined stray capacitances, within a relative small tolerance, resulting from conductive layers of the integrated circuit and the antenna structure.

Another object of the present invention is to provide a transponder comprised of an integrated circuit attached to a substrate with an antenna structure, which transponder has predefined stray capacitances, within a relative small tolerance, resulting from conductive layers of the integrated circuit and the antenna structure.

The object is achieved in accordance with the invention by means of a method of producing a transponder, comprising the steps of:

producing an integrated circuit by: applying a photoresist layer to a surface of a semiconductor device, generating a patterned mask by lithographically patterning the photoresist layer so that the photoresist layer comprises at least one aperture, and filling the aperture with a bump by depositing the bump on the surface utilizing the patterned mask; and attaching the integrated circuit with the patterned mask to a substrate, which comprises an antenna structure so that the bump is connected electrically to the antenna structure.

The transponder comprises the integrated circuit and the substrate. The substrate is, for instance, a plastic foil, and comprises the antenna structure which is, for instance, a conductive loop, a monopole antenna, or a dipole antenna. The integrated circuit further comprises the patterned mask, which is made from a photoresist and is used as a mask for the at least one bump deposited on the surface.

The integrated circuit is manufactured by first applying the photoresist layer on the surface of the semiconductor device. The semiconductor device is particularly a die. Thus, a plurality of integrated circuits can be manufactured utilizing a wafer and, after depositing the bump on the surface, separating the individual integrated circuits, each comprising a die, from the wafer.

The photoresist layer is utilized as the patterned mask for the bump, which is deposited on the surface utilizing a deposition process. Contrary to solder bumps, bumps made by the deposition process are relatively easy to manufacture. Additionally, deposited bumps have a relative high conductivity, particularly when the deposited bumps are gold bumps, as it is the case according to an embodiment of the inventive method.

The integrated circuit is then attached to the substrate. The integrated circuit still comprises the patterned mask, which is made from the photoresist material utilizing the photoresist layer. An advantage of a photoresist layer is, inter alia, that the photoresist layer can be manufactured having a predefined thickness within a relative small tolerance. A further advantage of a photoresist layer is, contrary to a thermoplastic resin layer, that the photoresist layer, especially if a negative resist is used, is cross-linked and can be relatively hard. Thus it is unlikely that said layer is deformed during the attaching step, which especially may include compression bonding of the integrated circuit on the substrate. As a result, the patterned mask made from the photoresist material can be manufactured having a predefined layer thickness, which will not change during the step of attaching the integrated circuit to the substrate. Therefore, it is achievable that a plurality of transponders manufactured according to the inventive method has essentially the same distance, i.e. a distance within a relative small tolerance, between their substrates and the surfaces of the semiconductor devices of the respective integrated circuits. Consequently, these transponders have the same stray capacitances, within a relative small tolerance, resulting, for instance, in an improved tuning of the resulting transponders.

Additionally, the patterned mask may function at least partly as an underfill between the substrate and the integrated circuit, absorbing at least partly thermo mechanical stress, which especially a plastic substrate may be exposed to. Furthermore, during the compression bonding not just the bumps are objected to the resulting pressure, but the pressure is rather distributed to the patterned mask. This also results in less stress to the antenna structure.

The surface may comprise at least one connection pad. Then, the aperture may match the connection pad or may be offset in respect to the connection pad. The connection pad may also be covered with a flash, particularly a gold flash, for an improved depositing of the bump. If the aperture is offset with respect to the connection pad, then a conductive structure, such as the flash may extend over the surface of the semiconductor device so that it is beneath the aperture. Thus the bump is deposited on the flash and therefore is connected, via the flash, to the connection pad.

The photoresist layer may be a multi-component layer having an adhesive characteristics for attaching the integrated circuit on the substrate. An example of such a multi-component layer is an acrylic based photoresists, which comprises UV-initiators and thermal initiators. Such a multi-component layer, therefore, can be treated utilizing the lithographic process for producing the aperture in the photoresist layer by UV-radiation and is partly cross-linked. During the final assembly process, the layer is thermally activated and cured completely as well as cross-linked to the substrate. In this case, no additional adhesive layer between the patterned mask and the substrate is necessary.

The bump is connected electrically to the antenna structure during the attaching step. In order to ensure a good connection, the bump may extend a bit above the patterned mask. Because of the patterned mask, which is left on the surface of the semiconductor device, only the part extending above the patterned mask is objected to deformation during the attaching step. Assuming the bump extends 20 μm from the surface of the semiconductor device and no patterned mask is used when attaching the integrated circuit to the substrate, then a 5% tolerance within the distance between the surface of the semiconductor device and the substrate due to the deformation during the attaching step results in a 5% tolerance of the corresponding stray capacitance. Since, according to the inventive method, the patterned mask made from the photoresist is left on the integrated circuit, only the part of the bump extending above the patterned mask deform during the attaching step. Assuming that the bump extends 5 μm above the patterned mask (which is 20 μm thick), then a 5% deformation of the part of the bump extending above the patterned mask will result in a variation of the resulting stray capacitance of less than just 1%.

In addition to extending above the patterned mask, the bump may overlap the patterned mask. This results in an improved electrical contact between the bump and the antenna structure.

The object is also achieved in accordance with the invention by means of a transponder, comprising:

an integrated circuit comprised of a semiconductor device, which comprises a surface, a patterned mask made from a photoresist layer applied to the surface, wherein the photoresist layer comprises at least one aperture filled with a bump; and a substrate with an antenna structure, the integrated circuit being attached with the patterned mask to the substrate, wherein the bump electrically connects the antenna structure.

The bump may be a gold bump, may extend a slight distance above the patterned mask and/or may overlap the patterned mask.

The surface may comprise a connection pad. Then, the aperture may match the connection pad or may be offset in respect to the connection pad.

The photoresist layer may be a multi-component layer having an adhesive characteristics in order to attach the integrated circuit on the substrate and/or have a predetermined thickness.

BRIEF DESCRIPTION OF THE DRAWINGS

The invention will be described in greater detail hereinafter, by way of non-limiting examples, with reference to the embodiments shown in the drawings.

DESCRIPTION OF EMBODIMENTS

Figure 3:
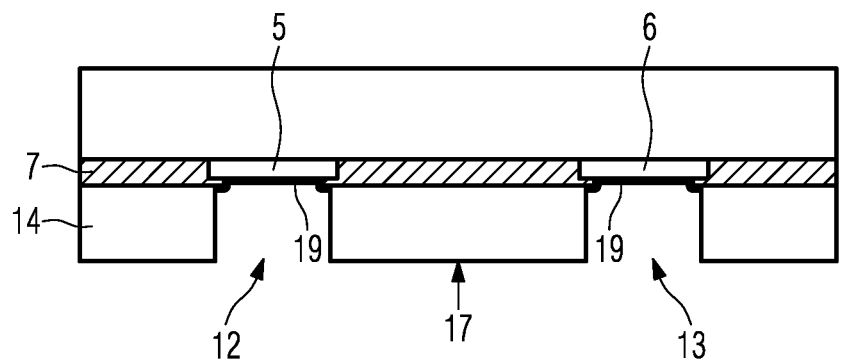
Figure 4:
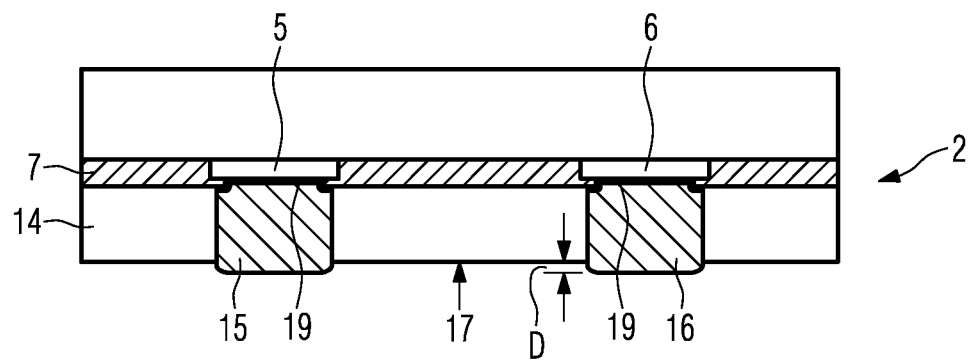
Figure 5:
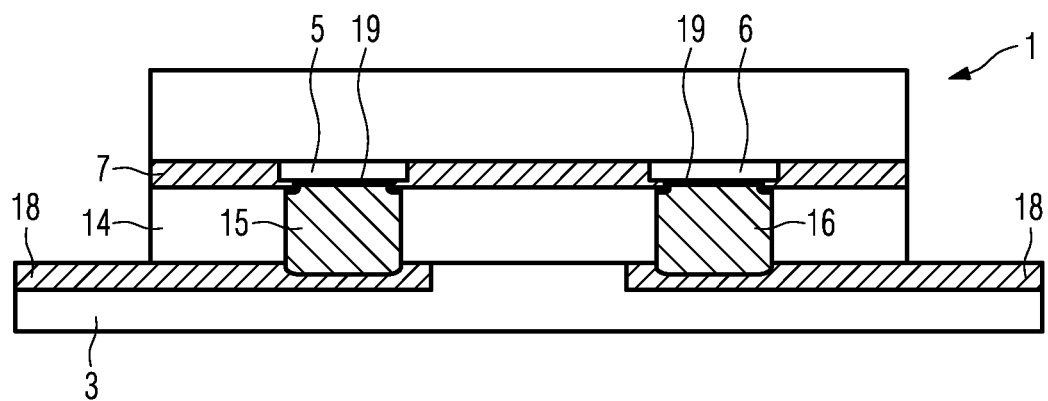
Figure 6:
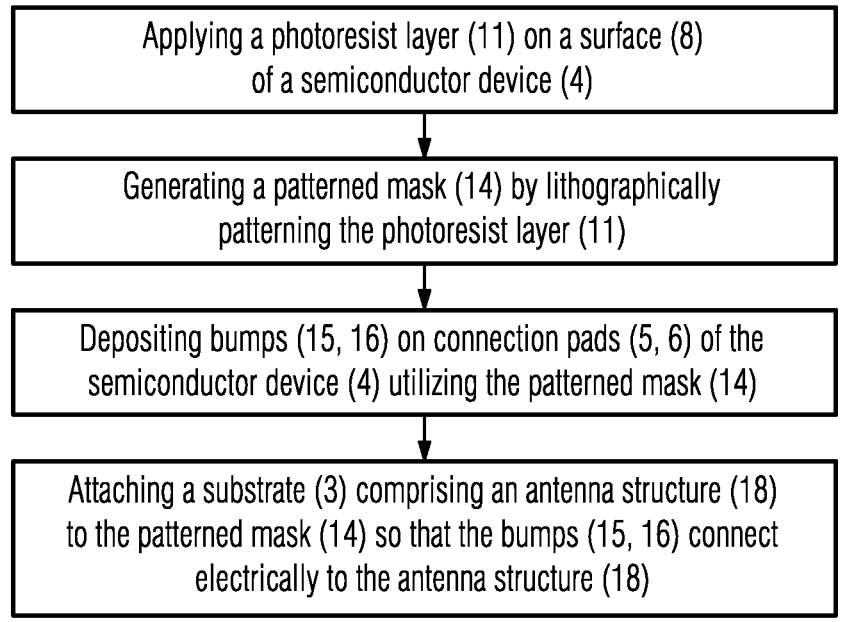
FIG. 6 is a flow chart illustrating the production of the transponder of FIGS. 1 to 5.

FIGS. 1 to 5 are steps illustrating the production of an exemplary embodiment of an inventive transponder 1. The finished transponder 1, which comprises an integrated circuit 2 and a substrate 3 with an antenna 18, is depicted in FIG. 5. FIG. 6 is an associated flow chart illustrating the production of the transponder 1.

Figure 1:
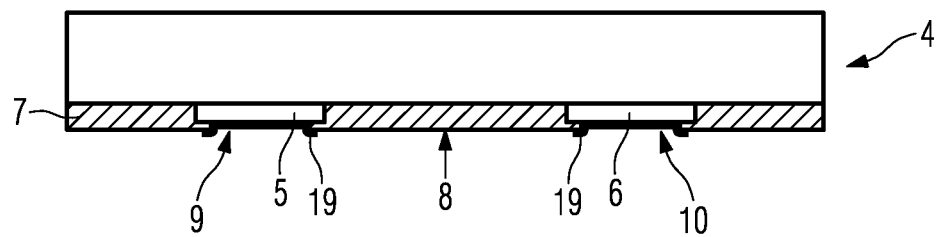
FIGS. 1 to 5 are steps illustrating the production of an exemplary embodiment of an inventive transponder comprising an integrated circuit.

In order to produce the transponder 1, a semiconductor device 4, as depicted in FIG. 1, is produced, for instance, on a wafer using commonly known techniques. For the exemplary embodiment, the semiconductor device 4 comprises the circuitry for processing signals received by the transponder 1 and for responding to the received signals, connection pads 5, 6 and a passivation layer 7. The connection pads 5, 6 are provided to be connected to the antenna 18 of the transponder 1. The passivation layer 7 is a sealing layer to prevent deterioration of the electric properties of the circuitry through chemical reaction, corrosion, or handling during a packaging process. The material of the passivation layer 7 is silicon dioxide for the exemplary embodiment and forms a surface 8 of the semiconductor device 4. The connection pads 5, 6 are accessible through apertures 9, 10 of the passivation layer 7.

For the exemplary embodiment, the semiconductor device 3 comprises further flashes 19 which are applied on the connection pads 5, 6 as a seed layer for the bump process. For the exemplary embodiment, the flashes 19 are made from gold, cover the side walls of the apertures 9, 10 and overlap slightly the passivation layer 7. The flashes 19 can be structured via an standard lithographic process or also by an ablation process. In case of not using an electro-less bumping process, the flashes 19 may be connected by conductive lines which are then separated during the singulation process of the wafer into dice by sawing, etching or another suitable process.

Figure 2:
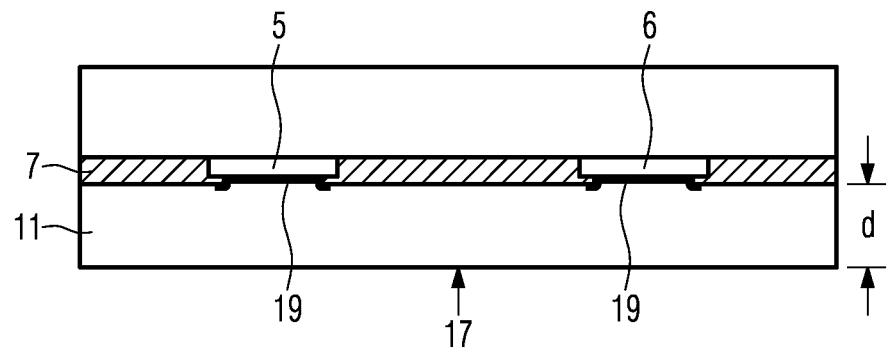

After that, a photoresist layer 11 is deposited on the surface 8 of the passivation layer 7, as it is shown in FIG. 2. For the exemplary embodiment, the photoresist layer 11 is deposited on the surface 8 utilizing a spinning process and has a thickness d of 18 μm. Spinning is a technique, in which the photoresist is spun onto the wafer, particularly on the surface 8, resulting in the photoresist layer 11. The photoresist layer 11 has a surface 17 facing away from the semiconductor device 4.

For the exemplary embodiment, the photoresist layer 11 is made from an acrylic based material comprising UV- and thermal initiators. This material does not only allow patterning the photoresist layer 11 in a patterning step using lithography, but also has an adhesive characteristics when heated up during the assembly process.

After hardening of the photoresist layer 11, the photoresist layer 11 is patterned using lithography. Lithography is a process of pattern transfer. When light is utilized, then this process is termed "photolithography". When the patterns are small enough to be measured in microns, then this process is referred to as "microlithography".

Due to the patterning process, apertures 12, 13, as shown in FIG. 3, are formed into the photoresist layer 11 matching and exposing the connection pads 5, 6. The photoresist layer 11 including the apertures 12, 13 forms a patterned mask 14, also having the surface 17 facing away from the semiconductor device 4 and is used for the next production step.

The next production step is depositing bumps 15, 16, which are made from gold for the exemplary embodiment, into the apertures 12, 13, as shown in FIG. 4, to form the integrated circuit 2, e.g. by means of a well known depositing process. For the exemplary embodiment, the bumps 15, 16 extend a slight distance D above the surface 17 of the patterned mask 14. For the exemplary embodiment, the distance D is 5 μm. Before continuing producing the transponder 1, the wafer is sawed in order to obtain individual integrated circuits 2 for the exemplary embodiment.

After that, the integrated circuit 2 is pressed against the substrate 3, as it is depicted in FIG. 5. The substrate 3 comprises the antenna 18, whose structure is printed (e.g. by use of conductive ink) on the substrate 3 for the exemplary embodiment. However, also etching, plating, etc. may be used for manufacturing the antenna 18.

The surface 17 of the photoresist layer 11 or the patterned mask 14 is also a surface of the integrated circuit 2. The integrated circuit 2, which includes the patterned mask 14, is pressed with its surface 17 against the substrate 3 and particularly on the side of the substrate 3, on which the antenna 18 is printed. Furthermore, the integrated circuit 2 is placed on the substrate 3, when pressed against it, so that the bumps 15, 16 are electrically connected to the structure of the antenna 18. Because of the projection of the bumps 15, 16 also an oxide layer of the conductive structure on the substrate 3 may be cracked so as to further decrease the transfer resistance between bumps 15, 16 and the conductive structure on the substrate 3. In this context it should be noted that the invention in principle is also applicable to capacitive coupling between the bumps 15, 16 and the antenna 18, although however, pressure and in turn stress is usually lower than for an electric connection when attaching the integrated circuit 2 to the substrate 3. The material of the photoresist layer 11 and the patterned mask 14 are made of an acrylic based material comprising UV- and thermal initiators for the exemplary embodiment. Thus, the patterned mask 14 is only pre-cured and can be fully cured during the assembly process by thermal activation, so that the integrated circuit 2 is attached to the substrate 3 without an additional adhesive layer.

FIG. 6 shows the steps for obtaining an inventive transponder 1. First, a photoresist layer 11 is applied to a surface 8 of a semiconductor device 4. Second, a patterned mask 14 is generated by a lithographic process. Third, bumps 15, 16 are deposited on the connection pads 5, 6 of the semiconductor device 4. Finally, the semiconductor device 4 is attached to a substrate 3.

Figure 7:
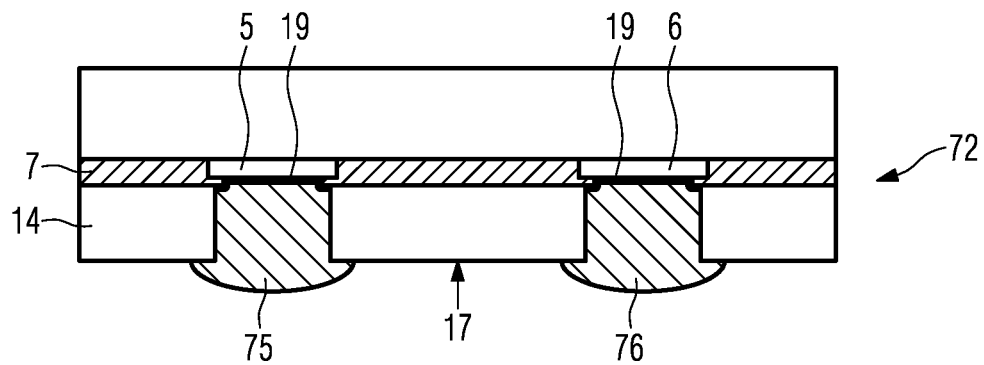
FIGS. 7 and 8 are alternative embodiments of an integrated circuit for the transponder of FIG. 5.

FIG. 7 shows an alternative embodiment of an integrated circuit 72, which can be used for the transponder 1 instead of the integrated circuit 2. If not explicitly mentioned, then components of the integrated circuit 72, which correspond to components of the integrated circuit 2, are denoted with the same reference signs.

The main difference between the two integrated circuits 2 and 72 are the bumps, which have the reference signs 75, 76 for the integrated circuit 72. Besides extending the slight distance D above the surface 17 of patterned mask 14, the bumps 75, 76 also slightly overlap the surface 17 of the patterned mask 14. Because of the increased area of the bumps 75, 76 they are less subjected to deformation during the assembling process. Accordingly, the tolerances for the stray capacitances may be further decreased.

Figure 8:
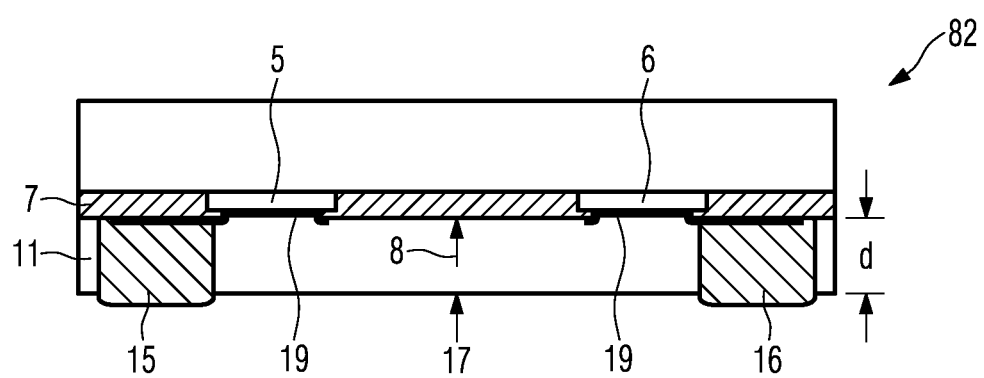

FIG. 8 shows an alternative embodiment of an integrated circuit 82, which can be used for the transponder 1 instead of the integrated circuit 2. If not explicitly mentioned, then components of the integrated circuit 82, which correspond to components of the integrated circuit 82, are denoted with the same reference signs.

The main difference between the two integrated circuits 2, 82 is that the bumps 15, 16 of the integrated circuit 82 are offset with respect to the connection pads 5, 6. Additionally, the flashes 19 extend over the surface 8 up to the apertures 12, 13 so that the bumps 15, 16 can be deposited on the flashes 19. One reason for that measure is to relocate the region of higher stress from the bumps 15, 16 to the border areas of the integrated circuit 82. By doing so, damageable structures of the semiconductor device 4 right under the bumps 15, 16 are less subjected to stress during and hence less subject to malfunction after the assembling process. One further reason may be to enlarge the distance between the bumps 15, 16 as the chips get smaller and smaller what might cause troubles when attaching the integrated circuit 82 to a substrate 3, which was made by use of a less developed technology, that is to say by use of a technology, which does not allow for very fine structures.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A method of producing a transponder, comprising the steps of:
  a) producing an integrated circuit by:
    applying a photoresist layer to a surface of a semiconductor device,
    generating a patterned mask by lithographically patterning said photoresist layer so that said photoresist layer comprises at least one aperture, and
    filling said aperture with a bump by depositing said bump using a deposition process on said surface utilizing said patterned mask; and b) attaching said integrated circuit with said patterned mask to a substrate, which comprises an antenna structure so that said bump is electrically connected to said antenna structure.

2. The method of claim 1, comprising the step of depositing a gold bump on said surface.

3. The method of claim 1, wherein said surface comprises a connection pad and said aperture matches said connection pad or is offset in respect to said connection pad.

4. The method of claim 1, comprising the step of applying said photoresist layer having a predefined thickness (d).

5. The method of claim 1, comprising the step of pressing said integrated circuit on said substrate when attaching said integrated circuit on said substrate.

6. The method of claim 1, wherein said photoresist layer is a multi-component layer having adhesive characteristics in order to connect said integrated circuit to said substrate.

7. The method of claim 1, wherein said bump extends a slight distance (D) above said patterned mask and/or overlaps said patterned mask.

8. A transponder, comprising:
an integrated circuit comprised of a semiconductor device, which comprises a surface, a patterned mask made from a photoresist layer applied on said surface, wherein said photoresist layer comprises at least one apertures filled with a deposited bump that is deposited using a deposition process; and
a substrate with an antenna structure, said integrated circuit being attached with said patterned mask to said substrate, wherein said bump electrically connects said antenna structure.

9. The transponder of claim 8, wherein said bump is a gold bump.

10. The transponder of claim 8, wherein said surface comprises a connection pad and said aperture matches said connection pad or is offset in respect to said connection pad.

11. The transponder of claim 8, wherein said bump extends a slight distance (D) above said patterned mask and/or overlaps said patterned mask.

12. The transponder of claim 8, wherein said photoresist layer is a multi-component layer having adhesive characteristics in order to connect said integrated circuit to said substrate and/or wherein said photoresist layer has a predetermined thickness (d).

13. A transponder, comprising:
an integrated circuit including
a semiconductor device having a surface and having at least one electrical circuit for communicating transponder signals;
a resistive layer portion disposed laterally on the surface and including an aperture through the resistive layer portion;
a conductive flash in the aperture with a portion of the flash extending laterally on the surface and immediately adjacent the aperture;
a deposition bump being configured and arranged on and electrically connected with the portion of the flash, and being offset laterally from the aperture; and
a substrate including an antenna structure, the substrate being attached to and configured and arranged with the integrated circuit and with the deposition bump for providing an electrical connection between the antenna structure and the integrated circuitry for communicatively passing the transponder signals.

14. The transponder of claim 13, wherein the bump extends a slight distance above said resistive layer, and wherein the semiconductor device further includes a passivating material configured and arranged to provide the surface.

15. The transponder of claim 13, wherein the flash is configured and arranged to electrically connect the deposition bump and the integrated circuit.

16. The transponder of claim 13, wherein the at least one aperture is configured and arranged to provide a connection pathway for the deposition bump to the flash.

17. The transponder of claim 13, wherein the bump includes gold.

18. The transponder of claim 13, wherein the resistive layer is a multi-component layer having adhesive characteristics configured and arranged to connect said integrated circuit to said substrate.

19. The transponder of claim 13, wherein the resistive layer is an acrylic based material including UV and thermal initiators.

* * * * *